United States Patent
Ma et al.

(10) Patent No.: US 11,933,815 B2
(45) Date of Patent: Mar. 19, 2024

(54) TEST FIXTURE

(71) Applicant: CHANGXIN MEMORY TECHNOLOGIES, INC., Hefei (CN)

(72) Inventors: Maosong Ma, Hefei (CN); Xinwang Chen, Hefei (CN); Zhangqin Zhou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 274 days.

(21) Appl. No.: 17/453,838

(22) Filed: Nov. 5, 2021

(65) Prior Publication Data

US 2022/0057432 A1 Feb. 24, 2022

Related U.S. Application Data

(63) Continuation of application No. PCT/CN2021/100666, filed on Jun. 17, 2021.

(30) Foreign Application Priority Data

Aug. 14, 2020 (CN) .......................... 202010817082.4

(51) Int. Cl.
G01R 1/04 (2006.01)
(52) U.S. Cl.
CPC .................................. G01R 1/0408 (2013.01)
(58) Field of Classification Search
CPC .. G01R 1/0408; G01R 1/0433; G01R 1/0483; G01R 1/07314; G01R 31/26; G01R 31/2808; G01R 31/2886
See application file for complete search history.

(56) References Cited

U.S. PATENT DOCUMENTS 6,118,286 A * 9/2000 Fredrickson ......... H05K 1/0268
324/756.02
7,466,158 B2 12/2008 Hirose
(Continued)

FOREIGN PATENT DOCUMENTS

CN 103399225 A 11/2013
CN 104267218 A 1/2015
(Continued)

OTHER PUBLICATIONS

Joseph Socha, "Designing High Performance Interposers with 3-port and 6-port S-parameters".

*Primary Examiner* — Tung X Nguyen
(74) *Attorney, Agent, or Firm* — Syncoda LLC; Feng Ma

(57) ABSTRACT

A test fixture includes a signal test board, a circuit routing, and a branch routing. The signal test board includes a first surface and a second surface. The first surface has a first pin and a test point. The second surface has a second pin. The circuit routing is located in the signal test board and configured to connect the first pin and a corresponding second pin. A portion of the circuit routing includes an upper routing connected with one first pin, a lower routing connected with one second pin, and a via-hole routing connected with two ends of the upper routing and the lower routing. One end, connected with the via-hole routing, of the upper routing is located in a projection area of the corresponding test point. The branch routing is located in the signal test board and configured to connect the test point with a corresponding upper routing.

15 Claims, 3 Drawing Sheets

(56) References Cited

U.S. PATENT DOCUMENTS

| | | | |
|---|---|---|---|
| 7,880,491 B2 | 2/2011 | Hirose | |
| 9,460,993 B2 | 10/2016 | Shelsky | |
| 2006/0087021 A1 | 4/2006 | Hirose | |
| 2009/0004891 A1* | 1/2009 | Grealish | ............ H05K 1/0268 |
| | | | 439/74 |
| 2009/0065774 A1 | 3/2009 | Hirose | |

FOREIGN PATENT DOCUMENTS

| | | |
|---|---|---|
| CN | 204203420 U | 3/2015 |
| CN | 105067846 A | 11/2015 |
| CN | 105527559 A | 4/2016 |
| CN | 108120853 A | 6/2018 |
| CN | 109240873 A | 1/2019 |
| CN | 208570587 U | 3/2019 |
| CN | 110568340 A | 12/2019 |

* cited by examiner

TEST FIXTURE

CROSS-REFERENCE TO RELATED APPLICATIONS

This is a continuation of International Application PCT/CN2021/100666 filed on Jun. 17, 2021, which claims priority to Chinese Patent Application No. 202010817082.4 filed on Aug. 14, 2020. The disclosures of the above-referenced applications are hereby incorporated by reference in their entirety.

BACKGROUND

An integrated circuit is an electronic circuit. Components of an integrated circuit such as various transistors, resistors, and capacitors are manufactured on a wafer by using a semiconductor manufacturing process, and the components are combined into a complete electronic circuit in a multilayer wiring mode.

SUMMARY

The disclosure relates to the field of semiconductors, and in particular to a test fixture capable of testing a high-frequency signal.

An embodiment of the disclosure provides a test fixture, and the test fixture includes a signal test board, at least one circuit routing, and a branch routing.

The signal test board includes a first surface, and a second surface opposing the first surface. The first surface has at least one first pin, and at least one test point located around the first pin, and the second surface has at least one second pin.

The at least one circuit routing is located in the signal test board and configured to connect the at least one first pin and the corresponding at least one second pin, and a portion of the circuit routing includes an upper routing connected with one of the at least one first pin, a lower routing connected with one of the at least one second pin, and a via-hole routing connected with two ends of the upper routing and the lower routing, and one end, connected with the via-hole routing, of the upper routing is located in a projection area of the corresponding test point.

The branch routing is located in the signal test board and configured to connect the test point with the corresponding upper routing.

DETAILED DESCRIPTION

A Dynamic Random-Access Memory (DRAM) is a semiconductor storage device commonly used in a computer, and consists of many repeated storage cells. Each storage cell usually includes a capacitor and a transistor. A gate of the transistor is connected with a word line, a drain is connected with a bit line, and a source is connected with the capacitor. A voltage signal on the word line can control opening or closing of the transistor, and then data information stored in the capacitor is read by the bit line, or the data information is written into the capacitor for storage by the bit line.

After a DRAM chip is packaged, a signal of an input/output port needs to be tested to verify the integrity of the signal. While the DRAM chip is welded and operated in a system, each chip pin is usually hidden under the chip, and cannot be directly measured by a probe of a test device. Therefore, it is necessary to provide a specific plug-in device or a test fixture to measure a signal of each pin of the DRAM chip without affecting the signal quality and the chip operation.

However, a typical plug-in device or the test fixture cannot perform a high-frequency signal test on the DRAM chip, which is not beneficial to the performance test of the DRAM chip.

Figure 1:
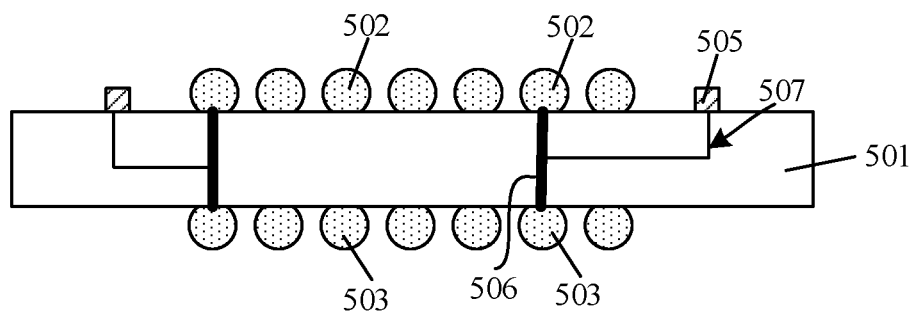
FIG. 1 is a structure schematic diagram of a test fixture in some implementations.

Referring to FIG. 1, an implementation provides a plug-in device or a test fixture, and it includes a signal test board 501. The signal test board 501 includes a first surface, and a second surface opposing the first surface, the first surface has at least one first pin 502 and at least one test point 505 located around the first pin 502, the second surface has at least one second pin 503, the first pin 502 is connected with the corresponding second pin 503 by a vertical routing 506 located in the signal test board 501, and the vertical routing 506 is connected with the corresponding test point 505 by a branch routing 507 located in the signal test board 501. While a test is performed, the first pin 502 is connected with the pin on the packaged chip to be tested, and the second pin 503 is connected with a bonding pad on a PCB system main board. While the test is performed, a test signal is applied to the second pin 503 through a Central Processing Unit (CPU), and a test machine receives a test feedback signal from the test point 505. Research has found that while a plug-in device or a test fixture with the previous structure is used for a high-frequency ($\geq 2$ GHz) signal test of the packaged chip to be tested, the attenuation amplitude of the test signal will be larger.

Figure 2:
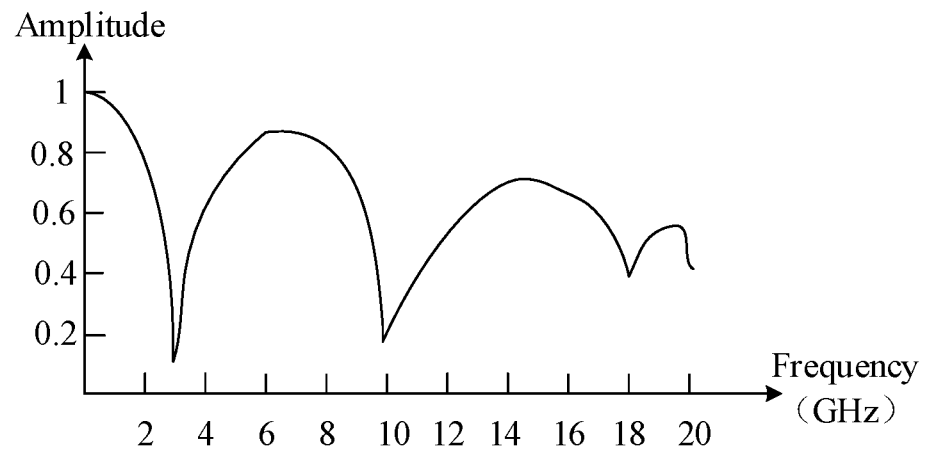
FIG. 2 is an attenuation schematic diagram of a test signal while the test fixture in FIG. 1 is used for testing.

As shown in FIG. 2, the abscissa in FIG. 2 represents the frequency of the test signal, and the ordinate represents the amplitude of the signal. When the frequency of the original test signal applied to the second pin 503 (referring to FIG. 1) is 2 GHz, after being tested by the plug-in device or the test fixture in the related technology, the test signal reaching the first pin 502 can be attenuated to about 80% of the original test signal; when the frequency of the test signal applied to the second pin 503 (referring to FIG. 1) is about 3.5 GHz, after being tested by the plug-in device or the test fixture in the related technology, the test signal reaching the first pin 502 can be attenuated to about 5% of the original test signal; and when the frequency of the test signal applied to the second pin 503 (referring to FIG. 1) is greater than 3.5 GHz, after being tested by the plug-in device or the test fixture in the related technology, the test signal reaching the first pin 502 can be attenuated to 80%-20% of the original test signal. Therefore, the plug-in device or the test fixture in the related technology cannot perform the high-frequency signal test on the packaged chip to be tested.

Further referring to FIG. 1, research has found that the reasons for the greater attenuation of high-frequency test signals are: the large signal reflection (the reflection of the test signal transmitted to the test point 505) will be formed at the test point 505 while the test is performed, a reflected signal is formed, and the reflected signal can be superposed on the vertical routing 506 along a path of the branch routing 507, thereby the test signal at the second pin 502 is affected. The test point 505 is connected with the vertical routing 506 by the longer (greater than 9 mm) branch routing 507, such that the reflected signal transmitted through the branch routing 507 has a larger phase difference with the original test signal on the vertical routing 506, and the reflected signal is superposed with the original test signal on the vertical routing 506 such that the amplitude of the test signal will be reduced. In the case that the phase difference between the reflected signal and the original test signal on the vertical routing 506 is 180 degrees (namely, reverse), the amplitude of a superposed signal will be 0, it means that the original test signal is completely swallowed. For an ordinary circuit board, the transmission speed of an electrical signal on the circuit board is about $1.5*10^8$ meters per second (m/s). It is assumed that the length of the branch routing 507 is 10 millimeters (mm), then the time delay of the reflected signal and the original test signal is 133.4 picoseconds (ps). At this time, for a signal with the frequency of 3.75 GHz, the phase difference between the reflected signal and the original test signal is exactly 180 degrees, therefore the amplitude of the superposed signal after superposition will become 0. For signals with other frequencies, although the amplitude of the superposed signal may not become 0, it still has a great influence.

In view of the above, the disclosure provides a test fixture, and the test fixture includes a signal test board, at least one circuit routing, and a branch routing. The signal test board includes a first surface, and a second surface opposing the first surface, the first surface has at least one first tube and at least one test point located around the first pin, and the second surface has at least one second pin. The at least one circuit routing is located in the signal test board and configured to connect the at least one first pin and the corresponding at least one second pin, and each circuit routing includes an upper routing connected with one of the at least one first pin, a lower routing connected with one of the at least one second pin, and a via-hole routing connected with two ends of the upper routing and the lower routing, and one end, connected with the via-hole routing, of the upper routing is located in a projection area of the corresponding test point. The branch routing is located in the signal test board and configured to connect the test point with the corresponding upper routing. While the test is performed, and when a larger reflected signal is generated at the test point, the circuit routing of a specific structure is configured, such that the length of the branch routing connected with the upper routing of the circuit routing can be very short (less than 1 mm), thereby a phase of the reflected signal generated at the test point after passing through the shorter branch routing is very close to a phase of a test signal on the circuit routing, thus the amplitude of the test signal in the circuit routing after the two are superposed is basically not reduced or the reduced amplitude is very small, such that the amplitude of the (high-frequency) test signal that reaches the first pin through the circuit routing cannot be attenuated basically or the attenuated amplitude is very small. In this way, the high-frequency signal test to the packaged chip to be tested can be achieved, and the efficiency and accuracy of the test can be guaranteed.

In order to make the purposes, features, and advantages of the disclosure more apparent and understandable, embodiments of the disclosure are described below in detail with reference to drawings. While the embodiments of the disclosure are described in detail, for ease of description, a schematic diagram cannot be partially enlarged according to a general scale, and the schematic diagram is only an example, it should not limit a scope of protection of the disclosure herein. In addition, the three-dimensional space dimensions of the length, width and depth should be included in actual production.

Figure 3:
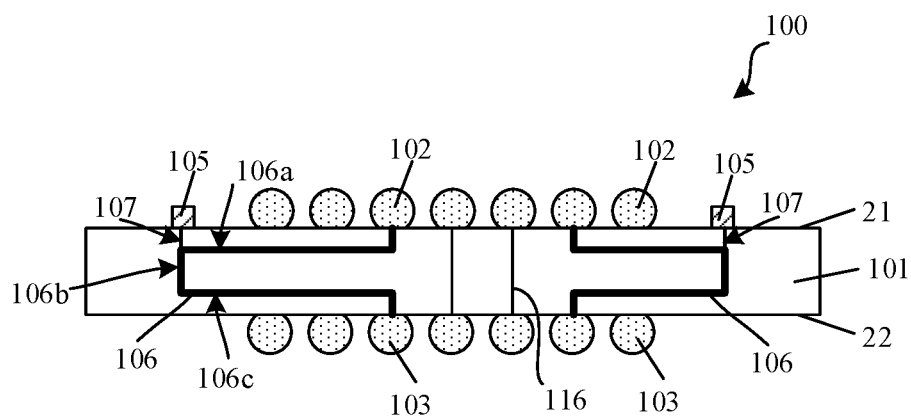
FIG. 3 is a first structure schematic diagram of a test fixture in an embodiment of the disclosure.

Referring to FIG. 3, an embodiment of the disclosure provides a test fixture 100, and the test fixture 100 includes a signal test board 101, at least one circuit routing and a branch routing.

The signal test board 101 includes a first surface 21 and a second surface 22 opposite to the first surface 21, the first surface 21 has at least one first pin 102 and at least one test point 105 located around the first pin 102, and the second surface 22 has at least one second pin 103.

At least one circuit routing is located in the signal test board 101 and configured to connect the at least one first pin 102 and the corresponding at least one second pin 103, and a portion of the circuit routing 106 includes an upper routing 106a connected with one of the at least one first pin 102, a lower routing 106c connected with one of the at least one second pin 103, and a via-hole routing 106b connected with two ends of the upper routing 106a and the lower routing 106c, and one end, connected with the via-hole routing 106b, of the upper routing 106a is located in a projection area of the corresponding test point 105.

The branch routing 107 is located in the signal test board 101 and configured to connect the test point 105 with the corresponding upper routing 106a. Here, the corresponding upper routing refers to the upper routing close to the test point.

The signal test board 101 is a PCB substrate or a resin substrate, the signal test board 101 can be a single-layer board or a multi-layer board, and the multi-layer board can be formed by pressing a plurality of single-layer boards up and down.

The first surface 21 of the signal test board 101 has the first pin 102, and the second surface 22 has the second pin 102. In an embodiment of the disclosure, the first pin 102 and the second pin 102 are solder balls, and the material of the solder balls can be any one or more of metals such as tin, tin-silver, tin-lead, tin-silver-copper, tin-silver-zinc, tin-zinc, tin-bismuth-indium, tin-indium, tin-gold, tin-copper, tin-zinc-indium, or tin-silver-antimony.

In other embodiments, the first pin 102 and the second pin 102 can be a metal bump, a solder layer or a bonding pad including the metal bump and located on the surface of the metal bump. The material of the metal bump or the bonding pad can be any one or more of aluminum, nickel, tin, tungsten, platinum, copper, titanium, chromium, tantalum, gold, and silver; and the material of the solder layer can be any one or more of metals such as tin, tin-silver, tin-lead, tin-silver-copper, tin-silver-zinc, tin-zinc, tin-bismuth-indium, tin-indium, tin-gold, tin-copper, tin-zinc-indium, or tin-silver-antimony.

The first pin is welded with the pin on the packaged chip to be tested during the test, and the second pin is connected with the bonding pad on the PCB main board during the test.

The number of the first pins is the same as the number of the pins on the packaged chip to be tested, or the number of the first pins is smaller than the number of the pins on the packaged chip to be tested. The number of the second pins 103 is the same as the number of the first pins 102, and one second pin 103 is correspondingly arranged below each first pin 102.

At least one circuit routing is configured to connect the at least one first pin 102 and the corresponding at least one second pin 103 in the signal test board 101. In an embodiment of the disclosure, the circuit routing includes a first circuit routing 116 and a second circuit routing 106, herein the first circuit routing 116 is a vertical routing, and the first circuit routing 116 is configured to directly connect the first pin 102 on the first surface 21 and the second pin 103 on the second surface 22, and the first circuit routing 116 does not need to be connected with the test point 105. The second circuit routing 106 in the embodiment of the disclosure needs to be connected with the corresponding test point 105. The second circuit routing 106 includes an upper routing 106a connected with one of the at least one first pin 102, a lower routing 106c connected with one of the at least one second pin 103, and a via-hole routing 106b connected with two ends of the upper routing 106a and the lower routing 106c. One end, connected with the via-hole routing 106b, of the upper routing 106a is located in a projection area of the corresponding test point 105. The test point 105 is connected with the corresponding upper routing 106a by the branch routing 107.

Research has found that there will be a large signal reflection at the test point 105, because the reflection intensity of a circuit to a signal is proportional to a reflection coefficient. The greater the reflection coefficient, the greater the reflection intensity. The reflection coefficient is calculated by the following formula (1):

$$\rho = (ZL - Z0)/(ZL + Z0) \quad \text{Formula (1).}$$

Herein, $\rho$ represents the reflection coefficient of the branch routing; $Z0$ is an impedance of the circuit routing 106 and the branch routing 107, $Z0$ is generally 50 ohm; and $ZL$ is a load impedance, and the load impedance between the first pin 102 and the second pin 103 is generally 40-60 ohm.

In the embodiment of the disclosure, because the reflection coefficient $\rho$ of the branch routing is very small, the reflected signal at the first pin 102 and the second pin 103 is very small, and $ZL$ at the test point 105 is in an open state, $ZL$ can be very large, thus the reflection coefficient $\rho$ can be very large, such that the reflected signal at the test point can be very large.

Please continue to refer to FIG. 3. In the embodiment of the disclosure, when the previous signal test board 101 is used for a signal integrity test, the first pin 102 of the signal test board 101 is connected with the third pin on the packaged chip to be tested, the original test signal (high-frequency, ≥2 GHz) is applied to the second pin 103 of the signal test board 101, and the test machine is connected with the test point 105 to receive the test feedback signal. While the test is performed, and when a relatively large reflected signal is generated at the test point 105, because of the second circuit routing 106 with the previous specific structure in the disclosure, the length of the branch routing 107 connected with the upper routing of the second circuit routing 106 in the disclosure can be very short (less than 1 mm), such that a phase of the reflected signal generated at the test point 105 after passing through the shorter branch routing 107 is very close to a phase of the test signal on the second circuit routing 106. Therefore, after the two are superposed, the amplitude of the test signal in the second circuit routing 106 is basically not reduced or the reduced amplitude is very small, namely the influence of the branch routing 107 on the test signal on the second circuit routing 106 can be reduced or the influence is smaller, such that the amplitude of the (high-frequency) test signal reaching the first pin 102 through the second circuit routing 106 is basically not attenuated or the attenuated amplitude is very small, thus the high-frequency signal test to the packaged chip to be tested can be achieved, and the efficiency and accuracy of the test can be guaranteed. In some embodiments, a bandwidth of a signal testable at the test point of the previous signal test board 101 is 2 GHz-20 GHz.

The arrangement of the second circuit routing 106 has various forms. In some embodiments, please refer to FIG. 3, the upper routing 106a, the lower routing 106c and the via-hole routing 106b in one circuit routing 106 are all distributed inside the signal test board 101. The signal test board 101 can be formed by pressing a plurality of single-layer boards, the upper routing 106a and the lower routing 106c can be formed on a certain single-layer board through deposition and etching processes, and the via-hole routing 106b can be formed in the corresponding single-layer board through via-hole etching and deposition processes, and then the plurality of the single-layer boards are connected. The via-hole routing 107 can also be formed in the corresponding single-layer board through the via-hole etching and deposition processes, and the via-hole routing 107 is vertically connected with the upper routing 106a directly below the test point, thus the length of the via-hole routing 107 can be shorter. In some embodiments, the length of the via-hole routing 107 is less than 1 mm. In other embodiments, the via-hole routing 107 can be less than 0.5 mm, or less than 0.3 mm.

Figure 4:
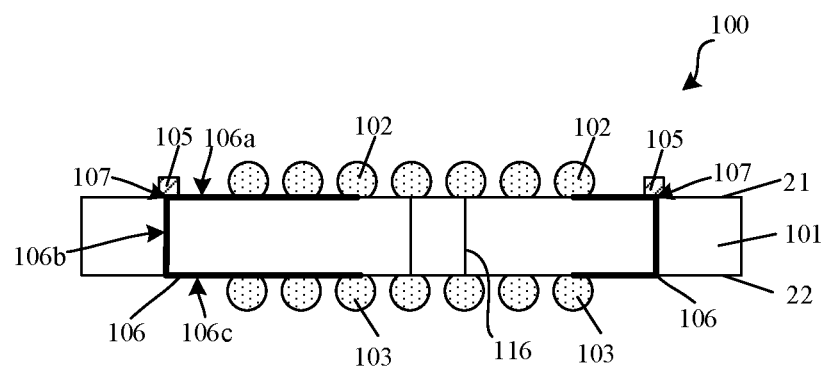
FIG. 4 is a second structure schematic diagram of a test fixture in an embodiment of the disclosure.

In some embodiments, referring to FIG. 4, the upper routing 106a in one second circuit routing 106 is distributed on the first surface 21 of the signal test board 101, the lower routing 106c is distributed on second surface 22 of the signal test board 101, and the via-hole routing 106b is distributed inside the signal test board 101. In this case, the branch routing 107 is a point, the length can be ignored, and the influence of the corresponding branch routing 107 on the test signal on the second circuit routing 106 can be minimal.

Figure 5:
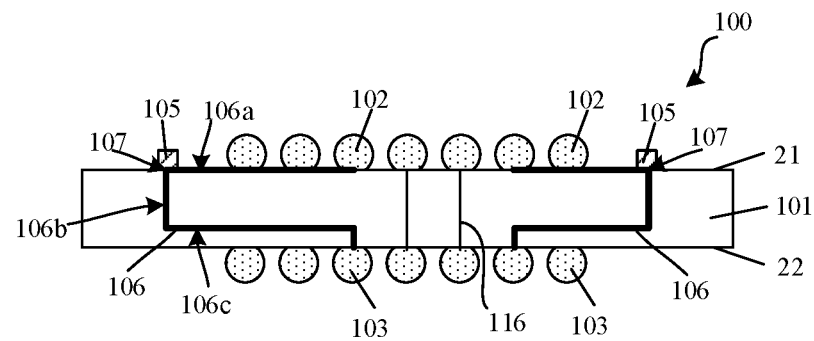
FIG. 5 is a third structure schematic diagram of a test fixture in an embodiment of the disclosure.

In some embodiments, referring to FIG. 5, the upper routing 106a in one second circuit routing 106 is distributed on the first surface 21 of the signal test board 101, and the lower routing 106c and the via-hole routing 106b are distributed inside the signal test board 101. In this case, the branch routing 107 is also a point, the length can be ignored, and the influence of the corresponding branch routing 107 on the test signal on the second circuit routing 106 can be minimal.

In some embodiments, the upper routing and the via-hole routing in one second circuit routing are distributed inside the signal test board, and the lower routing is distributed on the second surface of the signal test board.

In some embodiments, since there are many second circuit routings 106 and branch routings 107 connected with the corresponding second circuit routings in one signal test board 101, when the circuit routings 106 are arranged in one signal test board 101, a combination of any two or any three or any four of the above four arrangement modes can be used for arrangement, such that the reflection effect of the branch routing 107 on the high-frequency test signal can be very small, and the high-frequency signal test to the packaged chip to be tested can be achieved. At the same time, the arrangement of the second circuit routing 106 is optimized, and the density and quantity of the second circuit routings 106 are increased, so as to realize the signal test of more pins on more packaged chips to be tested.

In some embodiments, one end, connected with the via-hole routing 106b, of the upper routing 106a is located in an orthographic projection area of the corresponding test point 105, such that a distance, when the branch routing 107 is vertically connected with the upper routing 106a, is minimal, and the influence of the branch routing107 on the test signal on the second circuit routing 106 can be further reduced.

Figure 6:
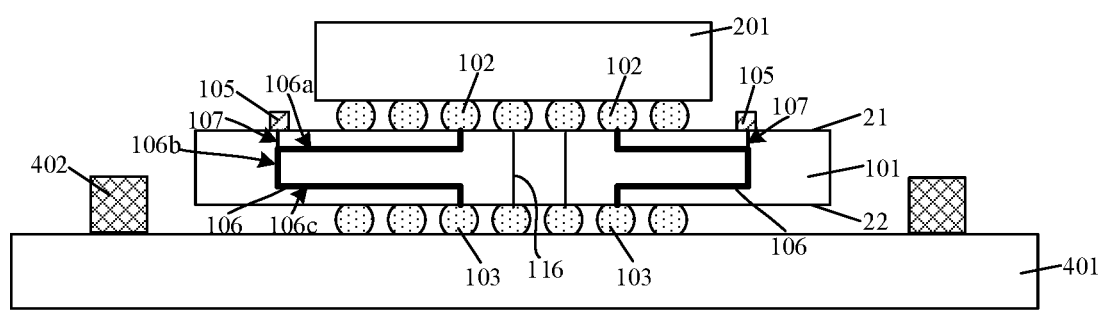
FIG. 6 is a fourth structure schematic diagram of a test fixture in an embodiment of the disclosure.

In some embodiments, please refer to FIG. 6, the test fixture further includes a PCB main board 401 and a packaged chip 201 to be tested. The packaged chip 201 to be tested has at least one third pin (unshown in the figure), the PCB main board 401 has a functional circuit and at least one fourth pin (unshown in the figure) connected with the functional circuit. The packaged chip 201 to be tested is located on the first surface 21 of the signal test board 101, at least one third pin on the packaged chip 201 to be tested is connected (or welded) with the corresponding at least one first pin 102 on the signal test board 101, the PCB main board 401 is located on the second surface 22 of the signal test board 101, and at least one fourth pin on the PCB main board 401 is connected with the corresponding at least one second pin 103 on the signal test board 101.

The packaged chip 201 to be tested is a memory chip, for example, a DRAM chip. The PCB main board 401 is connected with the packaged chip 201 to be tested to form a corresponding system or an integrated circuit to achieve a specific function. The PCB main board 401 has a functional circuit, and at least one fourth pin connected with the functional circuit. The functional circuit includes at least one main board component 402 protruding from the surface of the PCB main board and a connecting circuit connected with the at least one main board component 402. The PCB main board 401 can also have a control chip (CPU) (unshown in the figure), and the control chip can be connected with the second pin 103 on the signal test board 100 through a corresponding circuit formed in the PCB main board 401, and configured to apply the original test signal to the second pin 103.

In some embodiments, the size of the signal test board is larger than the size of the packaged chip 201 to be tested, such that the signal test board has an enough space to arrange more test points. In some embodiments, a difference value between the size of the signal test board and the size of the packaged chip to be tested is at least 6 mm. For example, the size of the packaged chip to be tested is 12 mm*8 mm, correspondingly the size of the signal test board 101 can be 18 mm*14 mm.

The signal integrity test can be performed on the packaged chip to be tested by the above text fixture.

Figure 7:
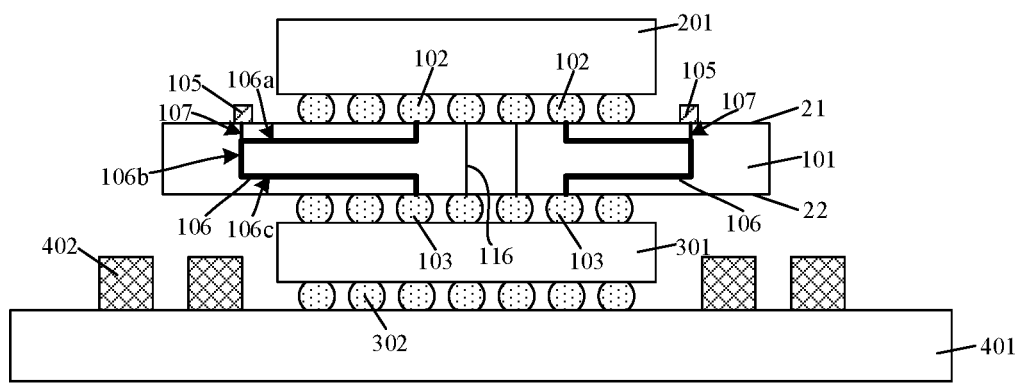
FIG. 7 is a fifth structure schematic diagram of a test fixture in an embodiment of the disclosure.

In some embodiments, please refer to FIG. 7. In addition to the packaged chip 201 to be tested and the PCB main board 401, the test fixture can further include a padding board 301. The packaged chip 201 to be tested has at least one third pin (unshown in the figure), the PCB main board 401 has a functional circuit and at least one fourth pin (unshown in the figure) connected with the functional circuit. The padding board 301 includes a third surface and a fourth surface opposing each other, the third surface has at least one fifth pin (unshown in the figure), and the fourth surface has at least one sixth pin 302. The padding board 301 further includes at least one connecting line (unshown in the figure) configured to connect the at least one fifth pin and the corresponding at least one sixth pin 302 (vertically). The packaged chip 201 to be tested is located on the first surface of the signal test board 101, and at least one third pin on the packaged chip 201 to be tested is connected (or welded) with the corresponding at least one first pin on the signal test board 101. The padding board 301 is located on the second surface of the signal test board 101, and at least one fifth pin on the padding board 301 is connected (or welded) with the corresponding at least one second pin on the signal test board 101. The PCB main board 401 is located on the sixth surface of the padding board 301, and at least one fourth pin on the PCB main board 401 is connected with the corresponding at least one sixth pin 302 on the padding board 301.

In some embodiments, the size of the padding board can be the same as the size of the packaged chip to be tested. Through the padding board, a distance between the signal test board and the PCB main board is increased, thereby the interference of the main board component on the PCB main board with the test signal board is avoided. The padding board and the signal test board are combined, such that the test fixture can perform a test of a higher frequency test signal on the chip to be tested.

In some embodiments, please continue to refer to FIG. 7, the fifth surface of the padding board 301 is higher than a top surface of the main board component 401, so as to better prevent the main board component 401 on the PCB main board from interfering with the signal test board 101, such that the signal test board 101 can perform the test of the higher-frequency test signal on the chip to be tested, and an attenuation of the signal can be further reduced. For example, the number of the padding boards 301 can be one or more, or two or three padding boards can be superposed for use, so as to meet the required thickness of the padding board.

While the test fixture of all embodiments of the disclosure is used for testing, the control chip (CPU) (unshown in the figure) on the PCB main board is connected with the second pin by the corresponding circuit formed in the PCB main board and the sixth pin and the fifth pin on the padding board, and configured to apply the (high-frequency) original test signal to the second pin.

In some embodiments, a test device is connected with the test point, and the test device can be an oscilloscope or a logic analyzer, etc.

Figure 8:
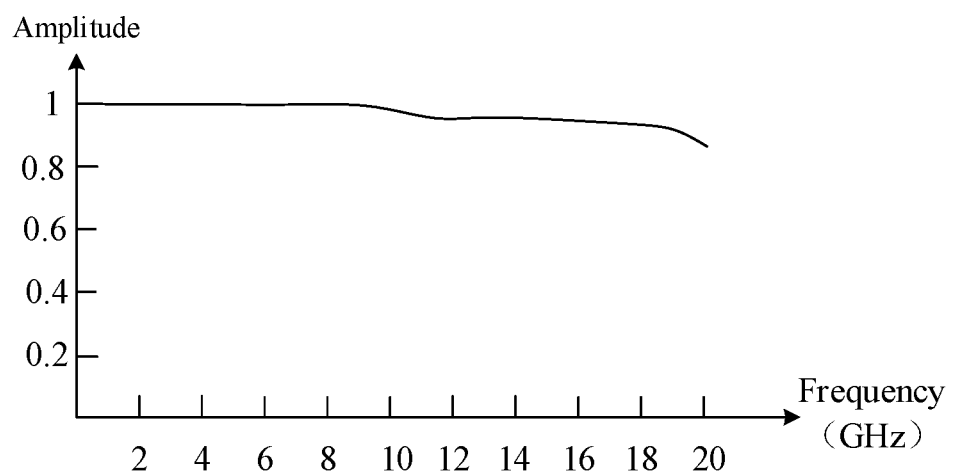
FIG. 8 is an attenuation schematic diagram of a test signal while the test fixture in the embodiment of the disclosure is used for testing.

Referring to FIG. 8, FIG. 8 is an attenuation schematic diagram of a test signal while the test fixture in an embodiment of the disclosure is used for testing, herein the abscissa represents the frequency of the test signal, and the ordinate represents the amplitude. It can be seen that while the test fixture of the disclosure is used for the test of the high-frequency signal, at 2 GHZ-12 GHZ, the attenuation amplitude of the signal is less than 10%, and at 12 GHZ-20 GHZ, the attenuation amplitude of the signal is less than 20%.

What is claimed is:
1. A test fixture, comprising:
a signal test board, wherein the signal test board comprises a first surface, and a second surface opposing the first surface, the first surface has at least one first pin, and at least one test point located around the first pin, and the second surface has at least one second pin;
at least one circuit routing located in the signal test board and configured to connect the at least one first pin and corresponding at least one second pin, wherein a portion of the circuit routing comprises an upper routing connected with one of the at least one first pin, a lower routing connected with one of the at least one second pin, and a via-hole routing connected with two ends of the upper routing and the lower routing, and wherein one end, connected with the via-hole routing, of the upper routing is located in a projection area of a corresponding test point;
a branch routing located in the signal test board and configured to connect the at least one test point with a corresponding upper routing; and
a Printed Circuit Board (PCB) main board and a packaged chip to be tested, the packaged chip to be tested has at least one third pin, and the PCB main board has a functional circuit, and at least one fourth pin connected with the functional circuit, the packaged chip to be tested is located on the first surface of the signal test board, and at least one third pin on the packaged chip to be tested is connected with a corresponding at least one first pin on the signal test board, the PCB main board is located on the second surface of the signal test board, and the at least one fourth pin on the PCB main board is connected with a corresponding at least one second pin on the signal test board.

2. The test fixture of claim 1, wherein the upper routing, the lower routing and the via-hole routing in one circuit routing are all distributed inside the signal test board.

3. The test fixture of claim 1, wherein in one circuit routing the upper routing is distributed on the first surface of the signal test board, the lower routing is distributed on the second surface of the signal test board, and the via-hole routing is distributed inside the signal test board.

4. The test fixture of claim 1, wherein in one circuit routing the upper routing is distributed on the first surface of the signal test board, and the lower routing and the via-hole routing are distributed inside the signal test board.

5. The test fixture of claim 1, wherein in one circuit routing the upper routing and the via-hole routing are distributed inside the signal test board, and the lower routing is distributed on the second surface of the signal test board.

6. The test fixture of claim 1, wherein one end, connected with the via-hole routing, of the upper routing is located in an orthographic projection area of a corresponding test point.

7. The test fixture of claim 1, wherein the branch routing is vertically connected with the upper routing.

8. The test fixture of claim 1, wherein a length of the branch routing is less than or equal to 0.3 mm.

9. A test fixture, comprising:
a signal test board, wherein the signal test board comprises a first surface, and a second surface opposing the first surface, the first surface has at least one first pin, and at least one test point located around the first pin, and the second surface has at least one second pin;
at least one circuit routing located in the signal test board and configured to connect the at least one first pin and corresponding at least one second pin, wherein a portion of the circuit routing comprises an upper routing connected with one of the at least one first pin, a lower routing connected with one of the at least one second pin, and a via-hole routing connected with two ends of the upper routing and the lower routing, and wherein one end, connected with the via-hole routing, of the upper routing is located in a projection area of a corresponding test point; and
a branch routing located in the signal test board and configured to connect the at least one test point with a corresponding upper routing;
wherein
the test fixture further comprises a PCB main board, a packaged chip to be tested, and a padding board;
the packaged chip to be tested has at least one third pin, the PCB main board has a functional circuit, and at least one fourth pin connected with the functional circuit;
the padding board comprises a third surface and a fourth surface opposing each other;
the third surface has at least one fifth pin, the fourth surface has at least one sixth pin, and the padding board has at least one connecting line for connecting the at least one fifth pin with a corresponding at least one sixth pin;
the packaged chip to be tested is located on the first surface of the signal test board, the at least one third pin on the packaged chip to be tested is connected with a corresponding at least one first pin on the signal test board;
the padding board is located on the second surface of the signal test board, and the at least one fifth pin on the padding board is connected with a corresponding at least one second pin on the signal test board;
the PCB main board is located on the sixth surface of the padding board; and
the at least one fourth pin on the PCB main board is connected with a corresponding at least one sixth pin on the padding board.

10. The test fixture of claim 9, wherein the functional circuit on the PCB main board comprises at least one main board component protruding from the surface of the PCB main board and a connecting circuit connected with the at least one main board component, and the fifth surface of the padding board is higher than a top surface of the main board component.

11. The test fixture of claim 9, wherein the test fixture comprises at least one padding board.

12. The test fixture of claim 1, wherein a size of the signal test board is larger than a size of the packaged chip to be tested.

13. The test fixture of claim 12, wherein a difference value between the size of the signal test board and the size of the packaged chip to be tested is at least 6 mm.

14. The test fixture of claim 1, wherein the packaged chip to be tested is a memory chip.

15. The test fixture of claim 14, wherein while a test is performed, the test point is connected with a test machine, and a bandwidth of a signal testable at the test point is 0 GHz-20 GHz.

* * * * *